(12) United States Patent
Yu

(10) Patent No.: US 11,039,542 B2
(45) Date of Patent: Jun. 15, 2021

(54) DISPLAY DEVICE

(71) Applicant: Au Optronics Corporation, Hsinchu (TW)

(72) Inventor: Ming-Hsuan Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/841,690

(22) Filed: Apr. 7, 2020

(65) Prior Publication Data

US 2021/0022257 A1    Jan. 21, 2021

Related U.S. Application Data

(60) Provisional application No. 62/874,677, filed on Jul. 16, 2019, provisional application No. 62/885,377, filed on Aug. 12, 2019.

(30) Foreign Application Priority Data

Dec. 31, 2019    (TW) .................................. 108148688

(51) Int. Cl.
*H05K 5/00* (2006.01)
*H05K 5/02* (2006.01)
(Continued)

(52) U.S. Cl.
CPC ......... *H05K 5/0017* (2013.01); *F16M 13/005* (2013.01); *H05K 5/0226* (2013.01);
(Continued)

(58) Field of Classification Search
CPC .. H05K 5/0017; H05K 5/0226; F16M 13/005; F16M 2200/066; F16M 2200/08;
(Continued)

(56) References Cited

U.S. PATENT DOCUMENTS 6,932,126 B1 * 8/2005 Spagnolo ............ B65B 67/1211
141/114
7,295,429 B2 * 11/2007 Jackson, Jr. ............... G06F 1/16
361/679.27
(Continued)

FOREIGN PATENT DOCUMENTS

CN    106814796    6/2017
CN    206602723    10/2017
(Continued)

*Primary Examiner* — Abhishek M Rathod
(74) *Attorney, Agent, or Firm* — JCIPRNET

(57) ABSTRACT

A display device including a main body and a support assembly is provided. The main body includes a first body and a second body that are pivotally connected to each other. A first display surface is located on the first body, and a second display surface is located on the second body. The first body and the second body are adapted to relatively pivot, so that an edge of the first body and an edge of the second body substantially jointly constitute a bending segment. The support assembly is movably connected to the main body. When the support assembly is unfolded from the main body, one end of the bending segment and the support assembly are adapted to jointly support the main body on a surface.

7 Claims, 8 Drawing Sheets

(51) Int. Cl.
  *G06F 1/16* (2006.01)
  *F16M 13/00* (2006.01)
  *H04B 1/3877* (2015.01)
  *H04M 1/02* (2006.01)

(52) U.S. Cl.
  CPC ... *F16M 2200/066* (2013.01); *F16M 2200/08* (2013.01); *G06F 1/1626* (2013.01); *G06F 1/1652* (2013.01); *G06F 1/1681* (2013.01); *H04B 1/3877* (2013.01); *H04M 1/0268* (2013.01)

(58) Field of Classification Search
  CPC .... G06F 1/1626; G06F 1/1652; G06F 1/1681; G06F 1/166; H04B 1/3877; H04M 1/0268; H04M 1/04
  See application file for complete search history.

(56) References Cited

U.S. PATENT DOCUMENTS

| | | | |
|---|---|---|---|
| 7,391,606 B2* | 6/2008 | Chen | F16M 11/126 248/917 |
| 7,490,427 B2* | 2/2009 | Dahlquist | G09F 1/10 248/463 |
| 7,800,892 B2* | 9/2010 | Gaskill | F16M 11/2021 361/679.04 |
| 7,841,575 B1* | 11/2010 | Sliger | F16M 13/02 248/454 |
| 8,011,623 B2* | 9/2011 | Hwang | F16M 11/105 248/166 |
| 8,201,687 B2* | 6/2012 | Zeliff | G06F 1/1632 206/320 |
| 8,274,784 B2* | 9/2012 | Franz | G06F 1/166 361/679.21 |
| 8,514,557 B2* | 8/2013 | Li | F16M 11/10 361/679.22 |
| 8,567,748 B2* | 10/2013 | Zhou | F16M 13/00 248/688 |
| 8,840,334 B2* | 9/2014 | Huang | H04M 1/0237 403/329 |
| 8,964,382 B2* | 2/2015 | Ashcraft | G06F 1/166 361/679.59 |
| 9,654,608 B2* | 5/2017 | Wallace | G06F 1/166 |
| 9,795,213 B1* | 10/2017 | Vier | F16M 11/2021 |
| 9,851,757 B2* | 12/2017 | Tsuchihashi | G06F 1/1671 |
| 10,037,050 B2* | 7/2018 | Lin | G06F 1/1656 |
| 10,060,574 B2* | 8/2018 | Zhang | F16M 13/00 |
| 10,413,027 B1* | 9/2019 | Olson | F16M 11/14 |
| 10,487,977 B2* | 11/2019 | Lo | F16M 13/005 |
| 10,627,870 B2* | 4/2020 | Kuo | G06F 1/1615 |
| 2010/0308202 A1* | 12/2010 | Hu | F16M 11/105 248/685 |
| 2012/0236527 A1* | 9/2012 | Zhou | F16M 11/38 361/807 |
| 2012/0275094 A1* | 11/2012 | Zhou | H04M 1/04 361/679.01 |
| 2012/0307441 A1* | 12/2012 | Hung | G06F 1/1662 361/679.09 |
| 2013/0075543 A1* | 3/2013 | Krohn | H05K 5/0204 248/121 |
| 2014/0332418 A1* | 11/2014 | Cheung | H04M 1/04 206/45.2 |
| 2015/0103057 A1* | 4/2015 | Lei | G06F 1/1684 345/179 |
| 2015/0277494 A1* | 10/2015 | Oakley | G06F 1/1633 361/679.55 |
| 2015/0346777 A1* | 12/2015 | Hosoya | F16M 13/00 361/679.56 |
| 2016/0161050 A1* | 6/2016 | Trebesius | F16M 11/245 248/122.1 |
| 2016/0277660 A1* | 9/2016 | Kaiser | F16B 2/12 |
| 2016/0309009 A1* | 10/2016 | Haskell | H04M 1/21 |
| 2016/0370826 A1* | 12/2016 | Wang | G06F 1/1632 |
| 2017/0150792 A1* | 6/2017 | Kim | A45C 13/002 |
| 2019/0178438 A1* | 6/2019 | Liang | F16M 13/04 |
| 2019/0335258 A1* | 10/2019 | Vaturi | G06F 1/1616 |
| 2020/0091951 A1* | 3/2020 | Zaloom | H04B 1/3877 |

FOREIGN PATENT DOCUMENTS

| | | |
|---|---|---|
| CN | 207529280 | 6/2018 |
| CN | 109798431 | 5/2019 |

\* cited by examiner

DISPLAY DEVICE

CROSS-REFERENCE TO RELATED APPLICATION

This application claims the priority benefits of U.S. provisional application Ser. No. 62/874,677, filed on Jul. 16, 2019, U.S. provisional application Ser. No. 62/885,377, filed on Aug. 12, 2019, and Taiwan patent application serial no. 108148688, filed on Dec. 31, 2019. The entirety of each of the above-mentioned patent applications is hereby incorporated by reference and made a part of this specification.

BACKGROUND

Technical Field

The disclosure relates to a display device and particularly to a display device including a plural of bodies.

Description of Related Art

Along with development of a display panel manufacturing process, the manufacturing technology of flexible display panels gradually becomes matured, so that flexible display panels are popular in consumer products. The flexible display panel may be applied to foldable electronic devices, such as foldable mobile phones and tablet computers, where the flexible display panel is disposed on two bodies of the electronic device at the same time and may be bent together with the two bodies which are being folded or unfolded.

When the two bodies of the electronic device and the flexible display panel of the electronic device are unfolded, a display area of the flexible display panel covers the two bodies of the electronic device and may provide a large display image for users to watch. When the electronic device is in the unfolded state, if the electronic device is placed flat on a desktop, a display surface of the electronic device is likely to reflect light from above, which may cause discomfort to the users. In addition, in the case where the display surface is additionally disposed on a back surface of the body of the electronic device, laying the electronic device on the desktop may cause the display surface at the back surface of the body of the electronic device to be scratched by the desktop. Although the unfolded electronic device may be placed on the desktop in an upright manner to avoid the above problems, the upright electronic device standing on the desktop may easily fall due to external forces, and the display image of the electronic device is perpendicular to the desktop, which does not allow the users to watch the image and use the device comfortably.

SUMMARY

The disclosure provides a display device having a main body which can firmly stand on a surface at an appropriate inclination angle.

An embodiment of the disclosure provides a display device including a main body and a support assembly. The main body includes a first body and a second body that are pivotally connected to each other. A first display surface is located on the first body, and a second display surface is located on the second body. The first body and the second body are adapted to relatively pivot, so that an edge of the first body and an edge of the second body substantially jointly constitute a bending segment. The support assembly is movably connected to the main body. When the support assembly is unfolded from the main body, an end of the bending segment and the support assembly are adapted to jointly support the main body on a surface.

In an embodiment of the disclosure, the first body and the second body are pivotally connected to each other along a first virtual axis. When the end of the bending segment and the support assembly jointly support the main body on the surface, the first virtual axis is inclined to the surface.

In an embodiment of the disclosure, the support assembly is connected to the first body but not connected to the second body.

In an embodiment of the disclosure, an accommodation recess is on a back surface of the first body, and the support assembly is adapted to be accommodated in the accommodation recess.

In an embodiment of the disclosure, the support assembly includes a first support member and a second support member. One end of the first support member is pivotally connected to the first body, and one end of the second support member is pivotally connected to the other end of the first support member. When the first support member is unfolded from the first body and the second support member is unfolded from the first support member, the end of the bending segment and the second support member are adapted to jointly support the main body on the surface.

In an embodiment of the disclosure, the first body and the second body are pivotally connected to each other along a first virtual axis, the first support member is pivotally connected to the first body along a second virtual axis, and the second virtual axis is inclined to the first virtual axis.

In an embodiment of the disclosure, the support assembly further includes a third support member pivotally connected to the first support member, and when the first support member is unfolded from the first body and the second support member is unfolded from the first support member, the third support member is adapted to be unfolded from the first support member and connected to the second support member, so that the first support member, the second support member, and the third support member define a shape of letter A.

In an embodiment of the disclosure, the support assembly further includes a fourth support member, and one end of a fourth support member is pivotally connected to the other end of the second support member but is not connected to the first support member. When the first support member is unfolded from the first body and the second support member is unfolded from the first support member, the fourth support member is adapted to be unfolded from the second support member, so that the other end of the fourth support member abuts against the second body.

In an embodiment of the disclosure, the first support member is a plate-shaped component, the second support member is pivotally connected to the first support member along a third virtual axis, and the third virtual axis is parallel to a thickness direction of the plate-shaped component.

In an embodiment of the disclosure, the first support member is a plate-shaped component, the second support member is pivotally connected to the first support member along a third virtual axis, and the third virtual axis is perpendicular to a thickness direction of the plate-shaped component.

In an embodiment of the disclosure, the first body and the second body are pivotally connected to each other along a first virtual axis. When the end of the bending segment and the second support member jointly support the main body on the surface, an orthogonal projection of the first virtual axis on the surface intersects the second support member.

An embodiment of the disclosure provides a display including a main body and two support assemblies. The main body includes a first body and a second body that are pivotally connected to each other. A first display surface is located on the first body, and a second display surface is located on the second body. The first body and the second body are adapted to relatively pivot, so that an edge of the first body and an edge of the second body substantially jointly constitute a bending segment. The two support assemblies are movably connected to the first body and the second body, respectively. When the two support assemblies are unfolded from the first body and the second body, respectively, the two support assemblies are adapted to jointly support the main body having the bending segment on a surface.

In an embodiment of the disclosure, when the two support assemblies are unfolded from the first body and the second body, respectively, an end of the bending segment and the two support assemblies are adapted to jointly support the main body on the surface.

In an embodiment of the disclosure, the first body and the second body are pivotally connected to each other along a first virtual axis. When the end of the bending segment and the two support assemblies jointly support the main body on the surface, the first virtual axis is inclined to the surface.

In an embodiment of the disclosure, when the two support assemblies jointly support the main body on the surface, the bending segment faces the surface but is not in contact with the surface.

In an embodiment of the disclosure, the main body has two accommodation slots which are respectively located in the first body and in the second body and respectively adjoin the edge of the first body and the edge of the second body. The two support assemblies are adapted to be accommodated in the two accommodation slots, respectively.

In an embodiment of the disclosure, each of the support assemblies includes a first support member, the first support members are slidably disposed on the first body and the second body, respectively, and the first support members are adapted to slide relative to the first body and the second body and extend from the edge of the first body and the edge of the second body, respectively.

In an embodiment of the disclosure, one of the first support members is slidably disposed at the first body in a direction parallel to the first display surface, and the other first support member is slidably disposed at the second body in a direction parallel to the second display surface.

In an embodiment of the disclosure, each of the support assemblies further includes a second support member, and each of the second support members is pivotally connected to a corresponding first support member of the first support members. When the first support members respectively extend from the edge of the first body and the edge of the second body, each of the second support members is adapted to be unfolded from the corresponding first support member and abut against the surface.

In an embodiment of the disclosure, each of the first support members is a plate-shaped component, each of the second support members is pivotally connected to the corresponding first support member along a second virtual axis, and the second virtual axis is perpendicular to a thickness direction of the plate-shaped component.

Based on the above description, the display device provided in one or more embodiments of the disclosure is additionally equipped with the support assembly for supporting the main body. The bending segment constituted by the edges of the bodies of the main body and the support assembly jointly support the main body, so that the main body may stand firmly on the surface at an appropriate inclination angle. In addition, the number of support assemblies may be two, and the support assemblies are respectively disposed at the first body and the second body of the main body, so as to support the main body more firmly.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
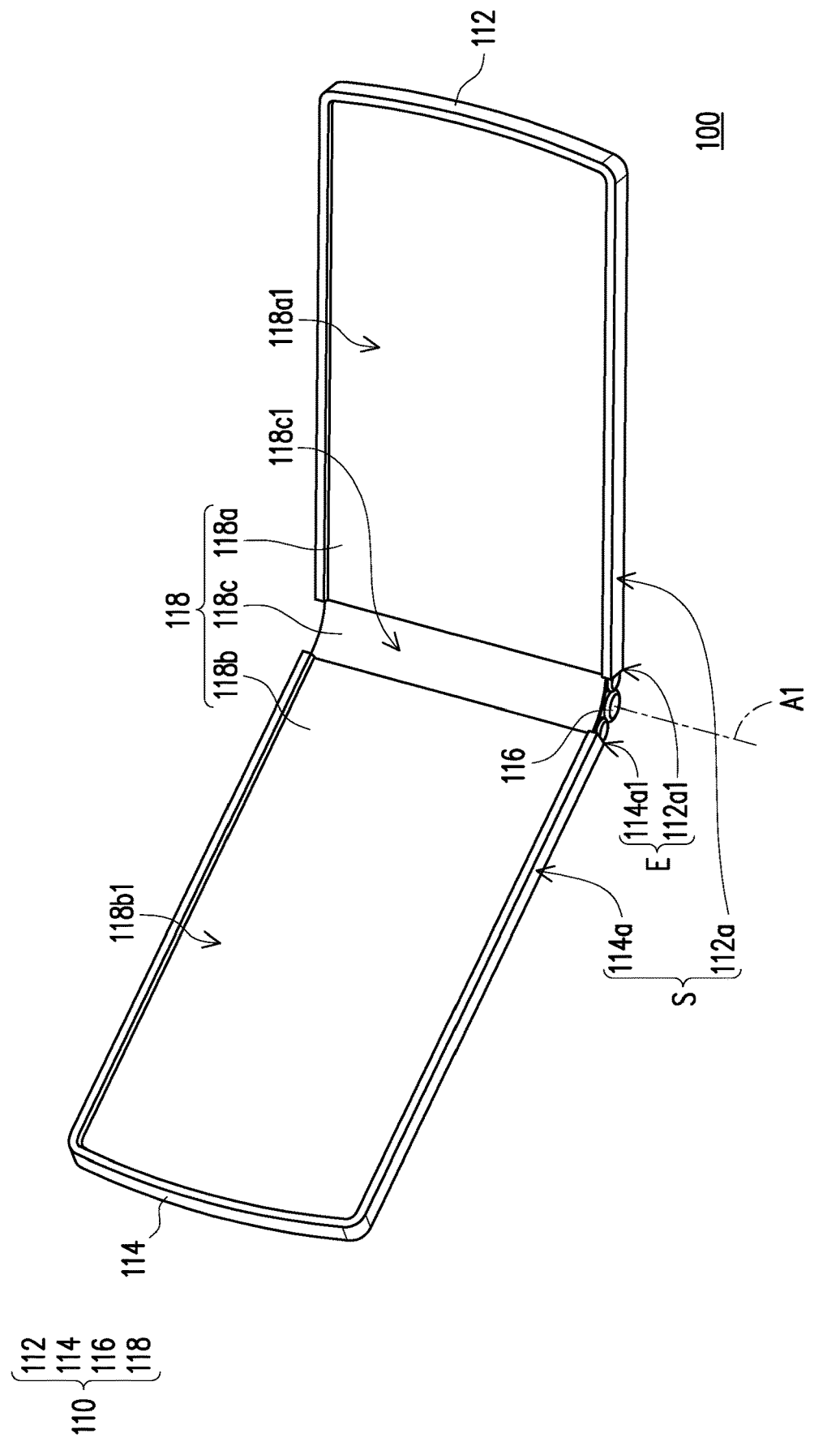
FIG. 1 is a three-dimensional view of a display device according to an embodiment of the disclosure.
Figure 2:
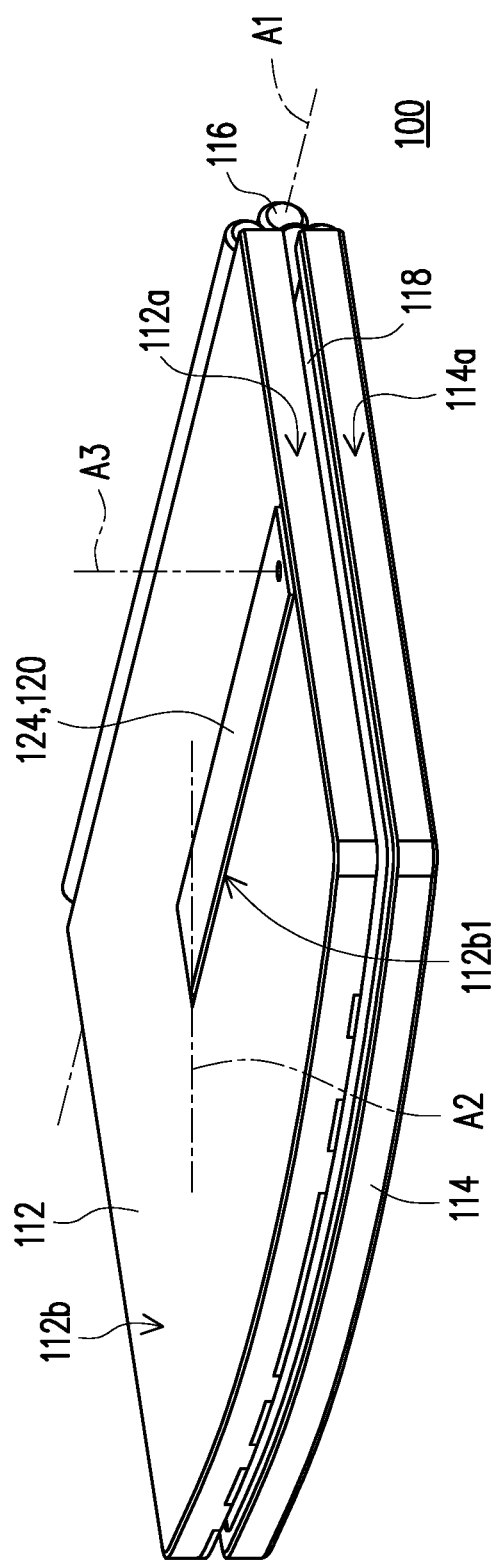
FIG. 2 illustrates a folded state of the display device depicted in FIG. 1.

FIG. 1 is a three-dimensional view of a display device according to an embodiment of the disclosure. FIG. 2 illustrates a folded state of the display device depicted in FIG. 1. With reference to FIG. 1 and FIG. 2, a display device 100 provided in the embodiment is, for instance, a smart phone or a tablet computer and includes a main body 110 and a support assembly 120. The main body 110 includes a first body 112, a second body 114, a pivot 116, and a flexible display panel 118. The first body 112 and the second body 114 are pivotally connected to each other along a first virtual axis A1 through the pivot 116. One portion of the flexible display panel 118 is disposed at the first body 112, and the other portion of the flexible display panel 118 is disposed at the second body 114. The flexible display panel 118 may be unfolded from the first body 112 and the second body 114 while the first body 112 and the second body 114 are relatively unfolded, as shown in FIG. 1, and the flexible display panel may be folded between the first body 112 and the second body 114 while the first body 112 and the second body 114 are relatively folded, as shown in FIG. 2.

Specifically, as shown in FIG. 1, the flexible display panel 118 includes a first segment 118a, a second segment 118b, and a third segment 118c. The first segment 118a is disposed at the first body 112 and constitutes a first display surface 118a1 on the first body 112, the second segment 118b is disposed at the second body 114 and constitutes a second display surface 118b1 on the second body 114, and the third segment 118c is connected between the first segment 118a and the second segment 118c and constitutes a third display surface 118c1 between the first display surface 118a1 and the second display surface 118*b*1. The flexible display panel 120 is, for instance, unfolded and folded through the bending operation of the third segment 118*c*. According to different display modes, the first segment 118*a* and the second segment 118*b* may display different images through the first display surface 118*a*1 and the second display surface 118*b*1, respectively, or the first display surface 118*a*1, the third display surface 118*c*1, and the second display surface 118*b*1 may all display one image. The first display surface 118*a*1, the third display surface 118*c*1, and the second display surface 118*b*1 are sequentially arranged, for instance, and the third display surface 118*c*1 is directly connected between the first display surface 118*a*1 and the second display surface 118*b*1.

Figure 3:
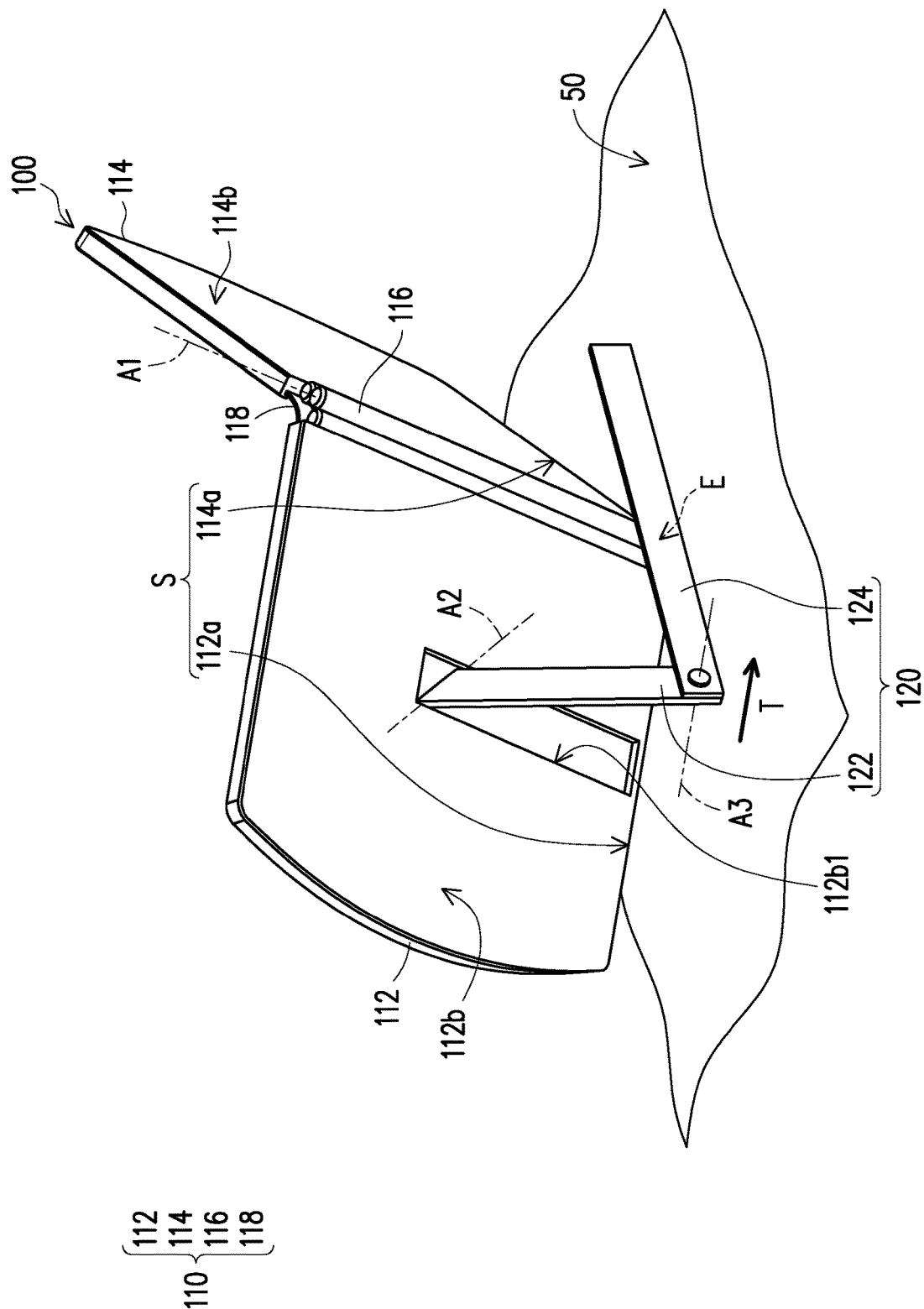
FIG. 3 illustrates an upright state of the main body depicted in FIG. 1.

The support assembly 120 is movably connected to the main body 110, and the main body 110 may stand in an upright manner through the support of the support assembly 120, which will be elaborated below with reference to the drawings. FIG. 3 illustrates an upright state of the main body depicted in FIG. 1. When the first body 112 and the second body 114 relatively pivot and in the state as shown in FIG. 1, an edge 112*a* of the first body 112 and an edge 114*a* of the second body 114 substantially jointly constitute a bending segment S. At this time, the user may unfold the support assembly 120 from the main body 110 as shown in FIG. 3, so as to support the main body 110 on a surface 50 by an end E of the bending segment S and the support assembly 120, and the first virtual axis A1 is inclined to the surface 50.

In detail, the end E of the bending segment S may actually include a distal end 112*a*1 (shown in FIG. 1) of the edge 112*a* adjacent to the pivot 116 and a distal end 114*a*1 (shown FIG. 1) of the edge 114*a* adjacent to the pivot 116. That is, in the state shown in FIG. 3, the main body 110 abuts against the surface 50 through the distal end 112*a*1 of the edge 112*a* and the distal end 114*a*1 of the edge 114*a*, for instance. However, the disclosure is not limited thereto. In other embodiments, the distal end of the pivot 116 may be a part of the end E of the bending segment S, and the main body 110 may abut against the surface 50 through the distal end of the pivot 116. The surface 50 may be a desktop or any other suitable carrying surface, which should not be construed as a limitation in the disclosure.

As provided above, the support assembly 120 is additionally disposed at the display device 100, and the main body 110 may be supported jointly by the bending segment S constituted by the edges of the bodies of the main body and the support assembly 120, so that the main body 110 may firmly stand on the surface 50 at an appropriate inclination angle as shown in FIG. 3. Specifically, the inclination angle is an included angle between the first virtual axis A1 and the surface 50.

As shown in FIG. 2 and FIG. 3, the support assembly 120 provided in the embodiment is connected to the first body 112 but not connected to the second body 114. An accommodation recess 112*b*1 is on a back surface 112*b* of the first body 112, and the support assembly 120 is adapted to be accommodated in the accommodation recess 112*b*1 as shown in FIG. 2 or unfolded as shown in FIG. 3. Further, the support assembly 120 provided in the embodiment includes a first support member 122 and a second support member 124, one end of the first support member 122 is pivotally connected to the first body 112 along a second virtual axis A2, and one end of the second support member 124 is pivotally connected to the other end of the first support member 122 along a third virtual axis A3. The first support member 122 and the second support member 124 may be accommodated in the accommodation recess 112*b*1 as shown in FIG. 2. As shown in FIG. 3, when the first support member 122 is unfolded from the first body 112 and the second support member 124 is unfolded from the first support member 122, the end E of the bending segment S and the second support member 124 are adapted to jointly support the main body 110 on the surface 50.

In the embodiment, the pivoting axis (i.e., the second virtual axis A2) of the first support member 122 and the first body 112 is designed to be inclined to the first virtual axis A1, so that the first support member 122 and the second support member 124 may be unfolded and extend to be at an appropriate position, and an orthogonal projection of the first virtual axis A1 on the surface 50 intersects the second support member 122. That is, the unfolded second support member 122 crosses over the first virtual axis A1 from the back of the first body 112 and extends to the back of the second body 114, so as to firmly support the first body 112 and the second body 114.

Figure 4:
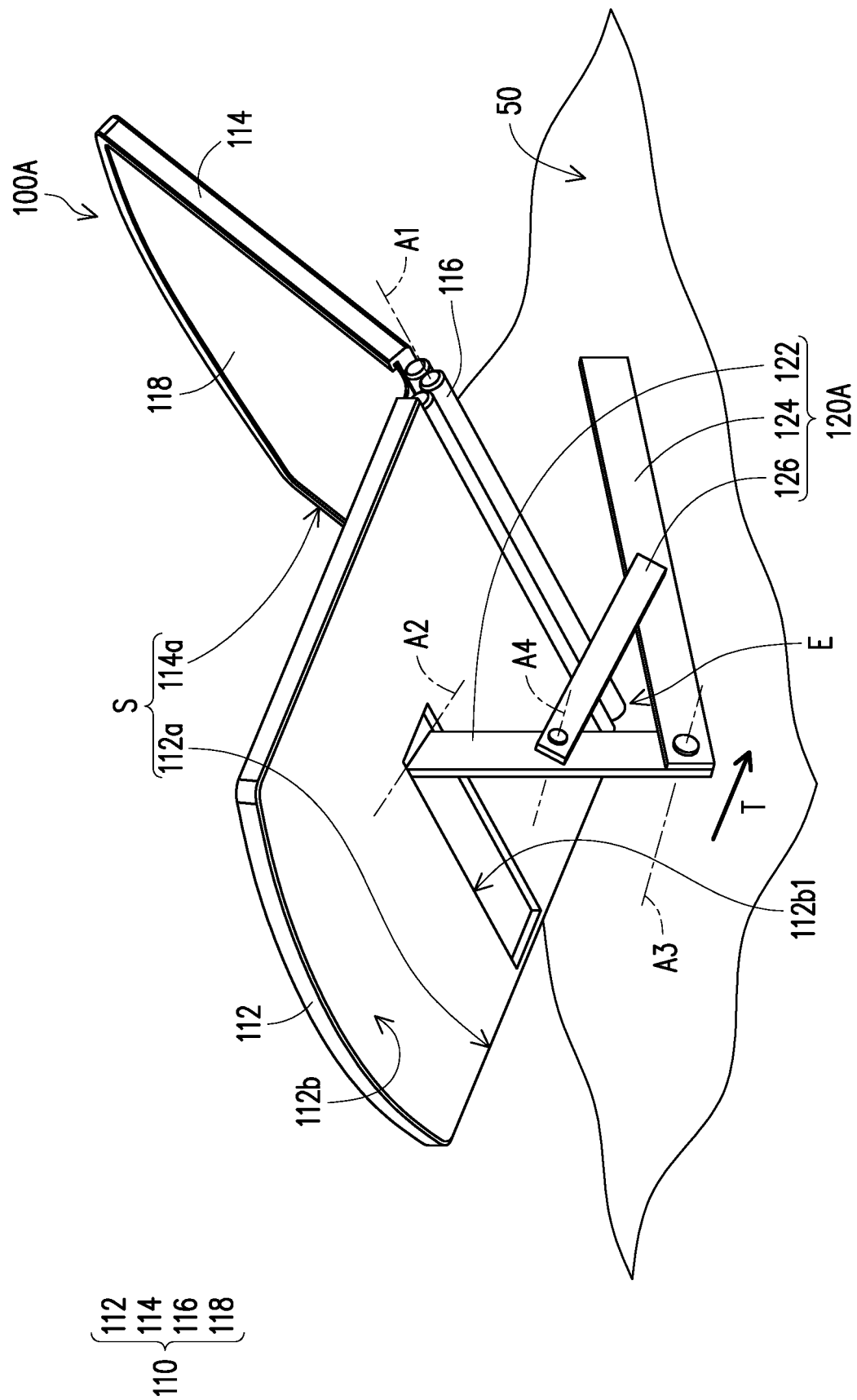
FIG. 4 illustrates a display device standing on a surface according to another embodiment of the disclosure.

FIG. 4 illustrates a display device standing on a surface according to another embodiment of the disclosure. The difference between the display device 100A shown in FIG. 4 and the display device 100 shown in FIG. 3 lies in that the support assembly 120A of the display device 100A further includes a third support member 126. One end of the third support member 126 is pivotally connected to the first support member 122 along a fourth virtual axis A4 parallel to the third virtual axis A3. As shown in FIG. 4, when the first support member 122 is unfolded from the first body 112 and the second support member 124 is unfolded from the first support member 122, the third support member 126 is adapted to be unfolded from the first support member 122, and the other end of the third support member 126 is connected to the second support member 124, so as to enhance the support strength of the support assembly 120. Here, the third support member 126 may be firmly connected to the second support member 124 through latching or the like, which should not be construed as a limitation in the disclosure. The first support member 122, the second support member 124, and the third support member 126 exemplarily define a shape of letter A.

Figure 5:
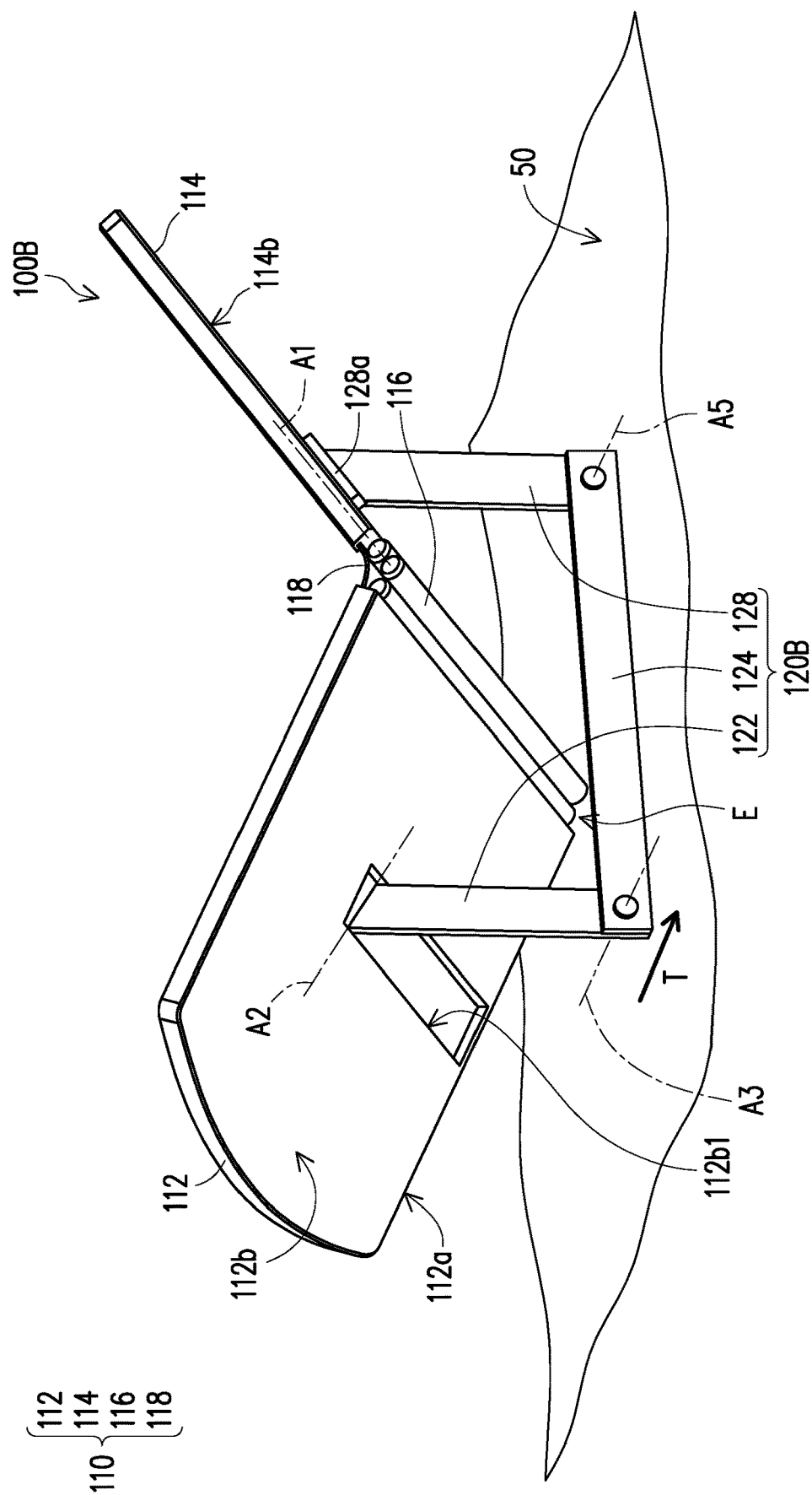
FIG. 5 illustrates a display device standing on a surface according to another embodiment of the disclosure.

FIG. 5 illustrates a display device standing on a surface according to another embodiment of the disclosure. The difference between the display device 100B shown in FIG. 5 and the display device 100 shown in FIG. 3 lies in that the support assembly 120B of the display device 100B further includes a fourth support member 128. One end of the fourth support member 128 is pivotally connected to the second support member 124 along a fifth virtual axis A5 parallel to the third virtual axis A3 but not connected to the first support member 122. As shown in FIG. 5, when the first support member 122 is unfolded from the first body 112 and the second support member 124 is unfolded from the first support member 122, the fourth support member 128 is adapted to be unfolded from the second support member 124, so that the other end of the fourth support member 128 abuts against the second body 114 to increase the support strength of the support assembly 120. Here, the other end of the fourth support member 128 may be provided with a soft material 128*a*. Where a display surface is disposed at the back surface 114*b*, the setting of the soft material 128*a* may prevent the fourth support member 128 from scratching the display surface. The first support member 122, the second support member 124, and the fourth support member 128 exemplarily define a shape of letter U, and the U-shaped opening faces toward the pivot 116, as shown in FIG. 5, which should however not be construed as a limitation in the disclosure.

Figure 6:
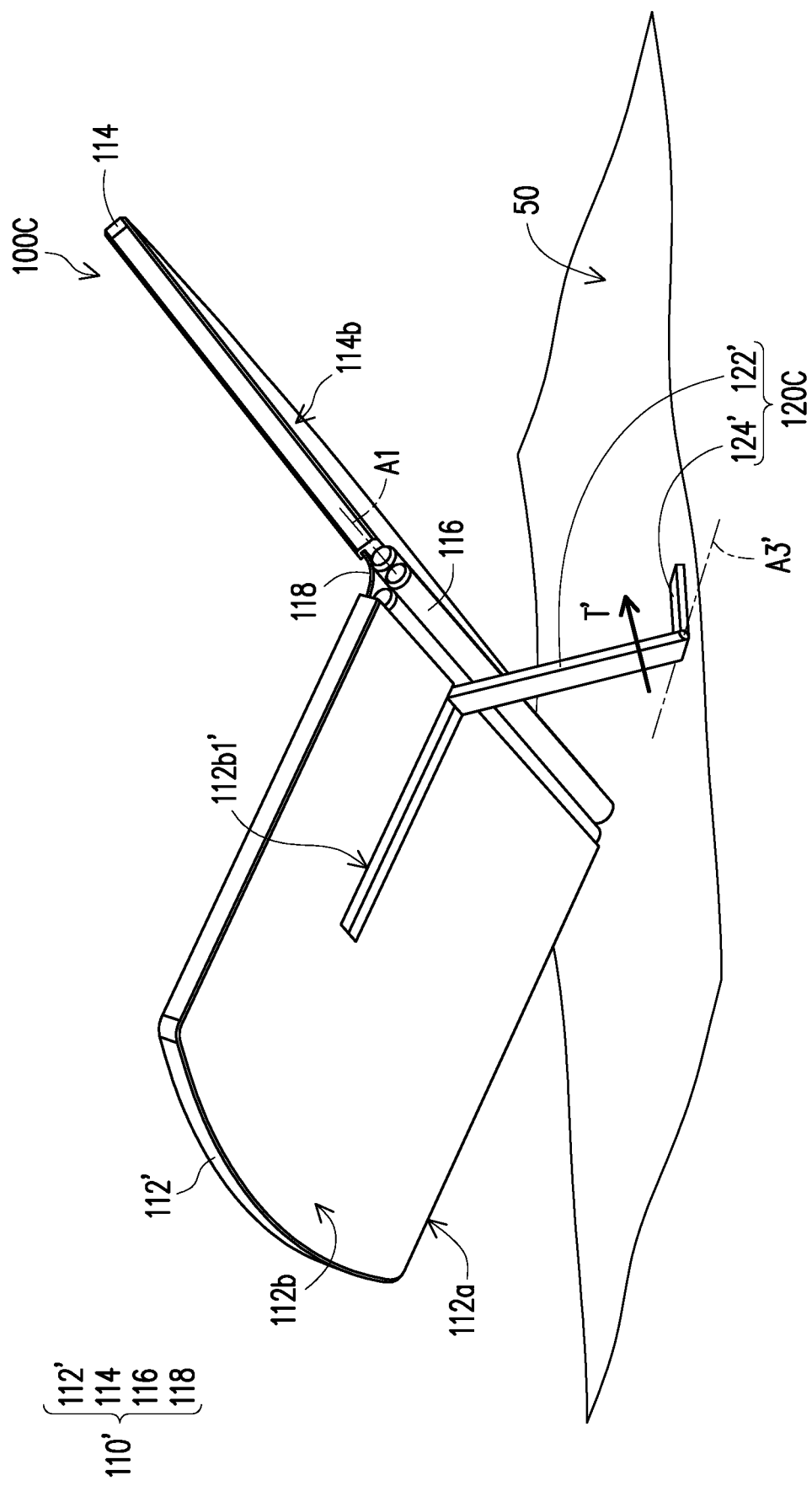
FIG. 6 illustrates a display device standing on a surface according to another embodiment of the disclosure.

In the embodiments shown in FIG. 3 to FIG. 5, the first support member 122 is a plate-shaped component, and the pivoting axis of the second support member 124 and the first support member 122 (i.e., the third virtual axis A3) is parallel to a thickness direction T of the plate-shaped component. In other embodiments, the third virtual axis may be perpendicular to the thickness direction of the plate-shaped component, which is exemplified below with reference to the drawing. FIG. 6 illustrates a display device standing on a surface according to another embodiment of the disclosure. The difference between the display device 100C shown in FIG. 6 and the display device 100 shown in FIG. 3 lies in that the accommodation recess 112b1' of the first body 112' in FIG. 6 is set to extend toward the pivot 116 in parallel to the edge 112a, while the accommodation recess 112b1 shown in FIG. 3 is set to extend toward the edge 112a in a direction perpendicular to the edge 112a. Further, the first support member 122' is unfolded from the accommodation recess 112b1' in FIG. 6 in a direction different from a direction in which the first support member 122 is unfolded from the accommodation recess 112b1 in FIG. 3. Accordingly, the pivoting axis of the first support member 122' and the second support member 124' (i.e., the third virtual axis A3') is designed to be perpendicular to a thickness direction T' of the plate-shaped component (i.e., the first support member 122'), so that the unfolded second support member 124' may extend in an appropriate direction and may firmly support the main body 110'.

Figure 7:
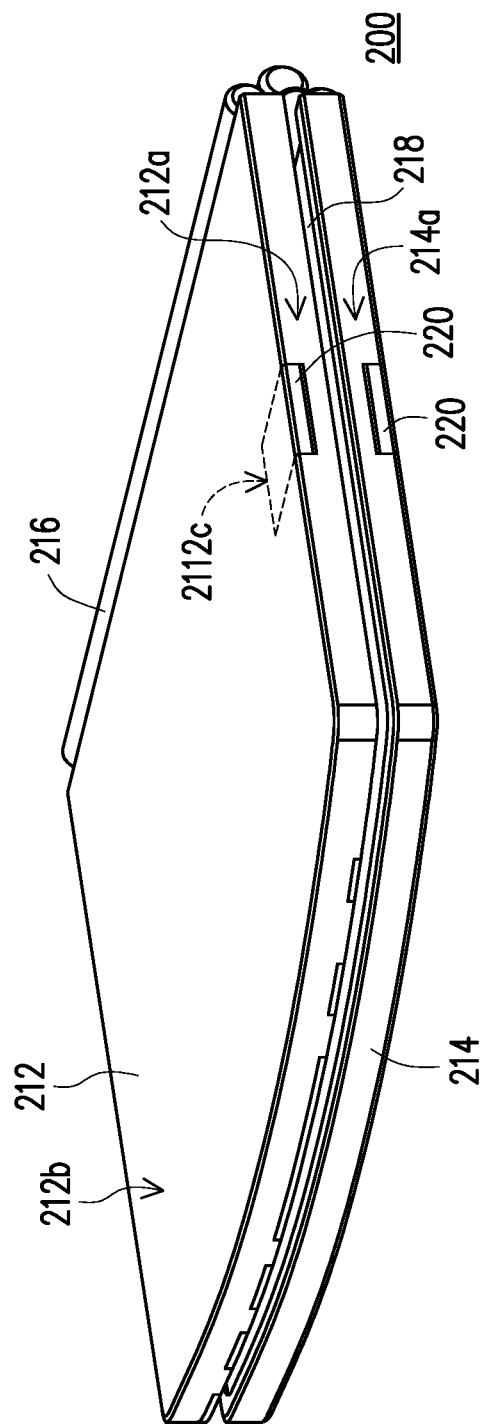
FIG. 7 illustrates a display device according to another embodiment of the disclosure.
Figure 8:
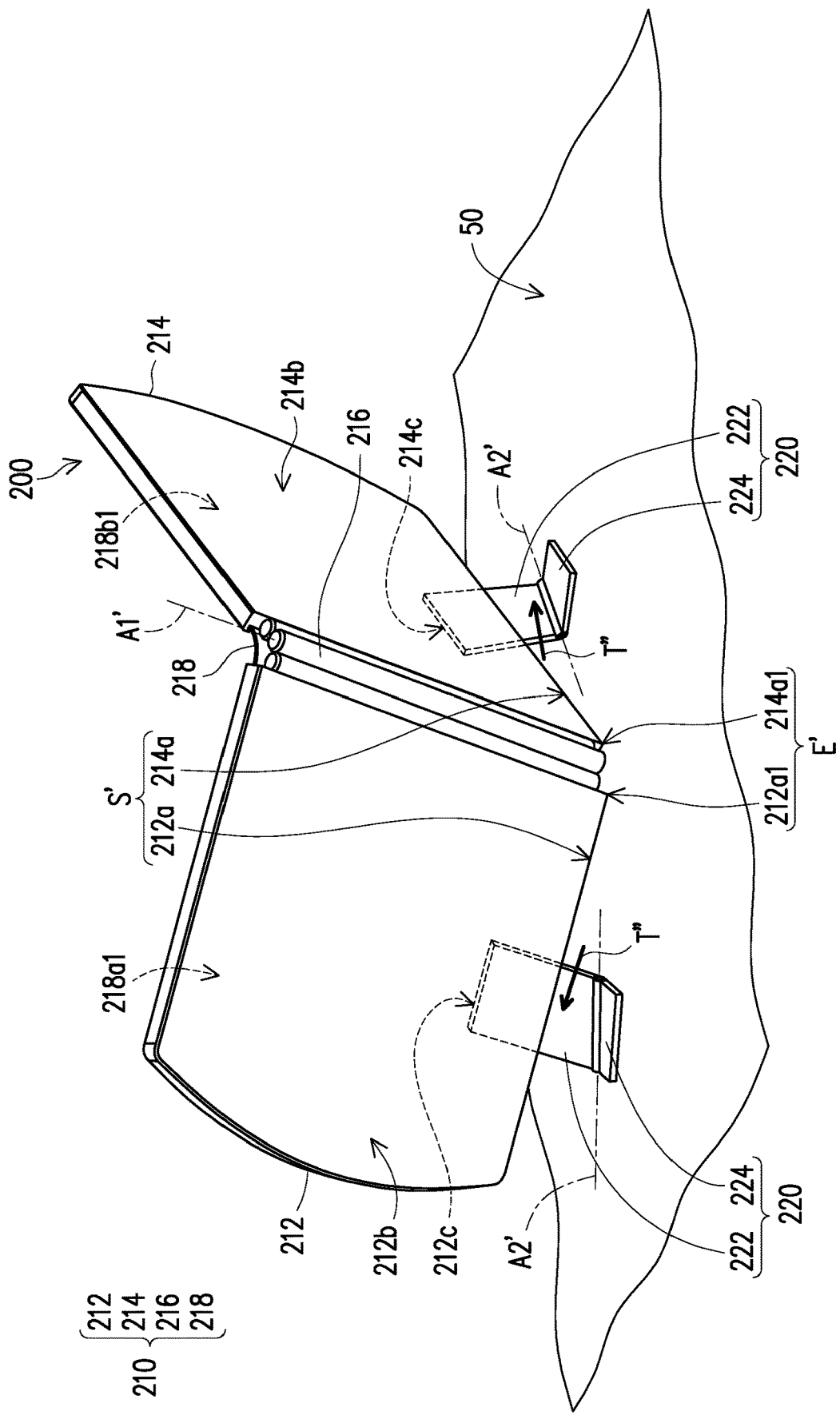
FIG. 8 illustrates a folded and upright state of the main body depicted in FIG. 7.

The number and the location of the support assembly are not limited in the disclosure, which will be exemplified with reference to the drawings. FIG. 7 illustrates a display device according to another embodiment of the disclosure. FIG. 8 illustrates a folded and upright state of the main body depicted in FIG. 7. In a display device 200 shown in FIG. 7 and FIG. 8, the way to arrange and operate a main body 210, a first body 212, an edge 212a, a back surface 212b, a first display surface 218a1, a second body 214, an edge 214a, a bending segment S', an end E' of the bending segment S', a distal end 212a1, a distal end 214a1, a back surface 214b, a second display surface 218b1, a pivot 216, a virtual axis A1', and a flexible display panel 218 is similar to or the same as the main body 110, the first body 112, the edge 112a, the back surface 112b, the first display surface 118a1, the second body 114, the edge 114a, the bending segment S, the end E of the bending segment S, the distal end 112a1, the distal end 114a1, the back surface 114b, the second display surface 118b1, the pivot 116, the virtual axis A1, and the flexible display panel 118 and thus will not be further described hereinafter.

The difference between the display device 200 provided in the embodiment and the display device provided in the previous embodiments lies in that the number of support assemblies 220 of the display device 200 is two. The two support assemblies 220 are movably connected to the first body 212 and the second body 214, respectively, and the two support assemblies may be accommodated in the main body 210 as shown in FIG. 7 or unfolded from the main body 210 as shown in FIG. 8. When the main body 210 is unfolded as shown in FIG. 8 and the two support assemblies 220 are respectively unfolded from the first body 212 and the second body 214 as shown in FIG. 8, the end E' of the bending segment S' and the two support assemblies 220 are adapted to jointly support the main body 210 on the surface 50. Since the number of the support assemblies 220 in this embodiment is two, the main body 210 may also be supported by the two support assemblies 220, so that the bending segment S' of the main body 210's facing the surface 50 is completely suspended above the surface 50 and is not in contact with the surface 50.

Specifically, the main body 210 provided in the present embodiment has two accommodation slots 212c and 214c which are respectively located in the first body 212 and in the second body 214 and adjoin the edge 212a of the first body 212 and the edge 214a of the second body 214, respectively. Each of the support assemblies 220 includes a first support member 222 and a second support member 224, the two first support members 222 are, for instance, plate-shaped components, and are respectively slidably disposed in the accommodation slot 212c in the first body 212 and the accommodation slot 214c in the second body 214 in a direction parallel to the first display surface 218a1 and a direction parallel to the second display surface 218b1. Each of the second support members 224 is pivotally connected to a corresponding first support member 222 along a second virtual axis A2', and the second virtual axis A2' is perpendicular to a thickness direction T" of the plate-shaped component (the first support member 222). The two first support members 222 are adapted to slide relative to the first body 212 and the second body 214 and respectively extend from the edge 212a of the first body 212 and the edge 214a of the second body 214 as shown in FIG. 8. When the two first support members 222 extend from the edge 212a of the first body 212 and the edge 214a of the second body 214, respectively, each of the second support members 224 is adapted to be unfolded from the corresponding first support member 212 and abut against the surface 50.

To sum up, the display device provided in one or more embodiments of the disclosure is additionally equipped with the support assembly for supporting the main body. The bending segment constituted by the edges of the bodies of the main body and the support assembly jointly support the main body, so that the main body may stand firmly on the surface at an appropriate inclination angle. In addition, the number of support assemblies may be two, and the support assemblies are respectively disposed at the first body and the second body of the main body, so as to support the main body more firmly.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A display device, comprising:
a main body, comprising a first body and a second body pivotally connected to each other, wherein a first display surface is located on the first body, a second display surface is located on the second body, and the first body and the second body are adapted to relatively pivot, so that an edge of the first body and an edge of the second body substantially jointly constitute a bending segment; and a support assembly movably connected to the main body, wherein when the support assembly is unfolded from the main body, an end of the bending segment and the support assembly are adapted to jointly support the main body on a surface;
wherein the support assembly comprises a first support member and a second support member, one end of the first support member is pivotally connected to the first body, one end of the second support member is pivotally connected to the other end of the first support member, and when the first support member is unfolded from the first body and the second support member is unfolded from the first support member, the end of the bending segment and the second support member are adapted to jointly support the main body on the surface; wherein the support assembly further comprises a third support member, the third support member is pivotally connected to the first support member, and when the first support member is unfolded from the first body and the second support member is unfolded from the first support member, the third support member is adapted to be unfolded from the first support member and connected to the second support member, so that the first support member, the second support member, and the third support member define a shape of letter A.

2. The display device according to claim 1, wherein the first body and the second body are pivotally connected to each other along a first virtual axis, and when the end of the bending segment and the support assembly jointly support the main body on the surface, the first virtual axis is inclined to the surface.

3. The display device according to claim 1, wherein the support assembly is connected to the first body but not connected to the second body.

4. The display device according to claim 3, wherein an accommodation recess is on a back surface of the first body, and the support assembly is adapted to be accommodated in the accommodation recess.

5. The display device according to claim 1, wherein the first body and the second body are pivotally connected to each other along a first virtual axis, the first support member is pivotally connected to the first body along a second virtual axis, and the second virtual axis is inclined to the first virtual axis.

6. The display device according to claim 1, wherein the first support member is a plate-shaped component, the second support member is pivotally connected to the first support member along a third virtual axis, and the third virtual axis is parallel to a thickness direction of the plate-shaped component.

7. The display device according to claim 1, wherein the first body and the second body are pivotally connected to each other along a first virtual axis, and when the end of the bending segment and the second support member jointly support the main body on the surface, an orthogonal projection of the first virtual axis on the surface intersects the second support member.

* * * * *